United States Patent [19]

Toraguchi et al.

[11] Patent Number: 5,160,152
[45] Date of Patent: Nov. 3, 1992

[54] ELECTROSTATIC CHUCK

[75] Inventors: Makoto Toraguchi; Genichi Katagiri; Yasushi Sakakibara, all of Kawasaki, Japan

[73] Assignee: Fuji Electric Co., Ltd., Kanagawa, Japan

[21] Appl. No.: 667,749

[22] Filed: Mar. 11, 1991

[30] Foreign Application Priority Data

Mar. 13, 1990 [JP] Japan .................................. 2-61681
Jan. 21, 1991 [JP] Japan .................................. 3-4811

[51] Int. Cl.$^5$ ........................... B25B 11/00; B23Q 3/15
[52] U.S. Cl. ..................................... 279/128; 361/234
[58] Field of Search ............... 279/1 M, 128; 269/8; 361/234

[56] References Cited

U.S. PATENT DOCUMENTS

| | | | |
|---|---|---|---|
| 4,645,218 | 2/1987 | Ooshio et al. | 279/1 M |
| 4,692,836 | 9/1987 | Suzuki | 361/234 |
| 5,055,964 | 10/1991 | Logan et al. | 279/1 M X |

FOREIGN PATENT DOCUMENTS

| | | | |
|---|---|---|---|
| 171011 | 2/1986 | European Pat. Off. | |
| 1-251735 | 6/1989 | Japan. | |
| 313954 | 12/1989 | Japan | 269/8 |
| 2106325 | 4/1983 | United Kingdom. | |
| 2147459 | 5/1985 | United Kingdom. | |
| 2154365 | 9/1985 | United Kingdom. | |

Primary Examiner—Steven C. Bishop
Attorney, Agent, or Firm—Spencer, Frank & Schneider

[57] ABSTRACT

Herein provided is an electrostatic chuck whose surface is processed so as to have projections and recesses, which has a simple structure and which makes it possible to establish a uniform temperature distribution on a wafer surface when the wafer is held on the processed surface thereof through the use of an electrostatic attractive force. The uneven surface configuration of the electrostatic chuck is designed so that the proportion of the area occupied by the projected surface in the peripheral portion, i.e., in the relatively outer region of the surface, is smaller than that of the area occupied by the projected surface in the central portion, i.e., in the relatively inner region of the surface of the electrostatic chuck, in order to change the rate of heat transmission so as to be larger in the central portion than in the peripheral portion between the wafer and the electrostatic chuck. In this case, the height of the projections is limited to the range of from 10 to 70 μm so as to perform effective control of the temperature distribution on the wafer by such adjustment of the proportion of the area occupied by the projections.

13 Claims, 6 Drawing Sheets

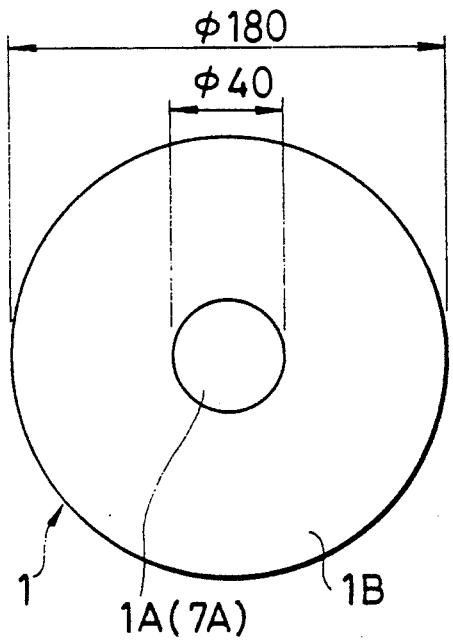
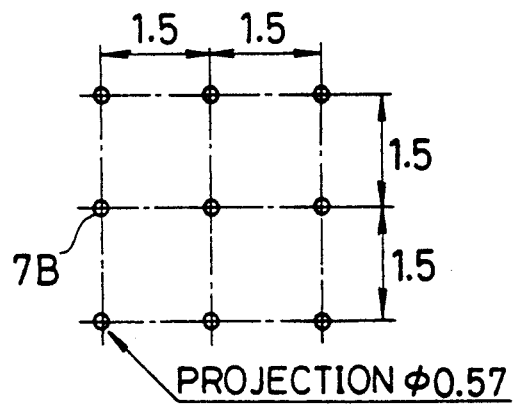
FIG.2A    FIG.2B
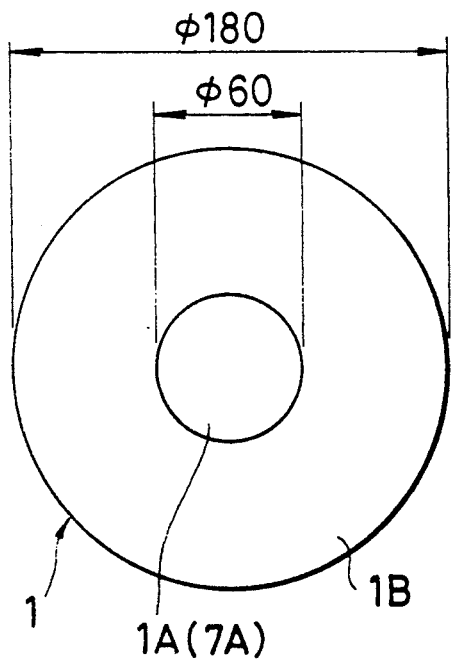
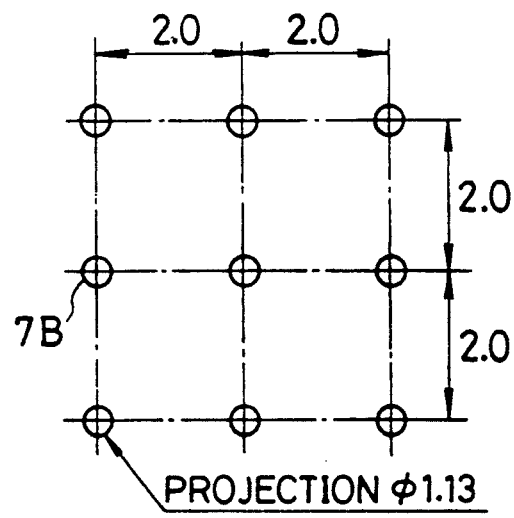
FIG.3A    FIG.3B

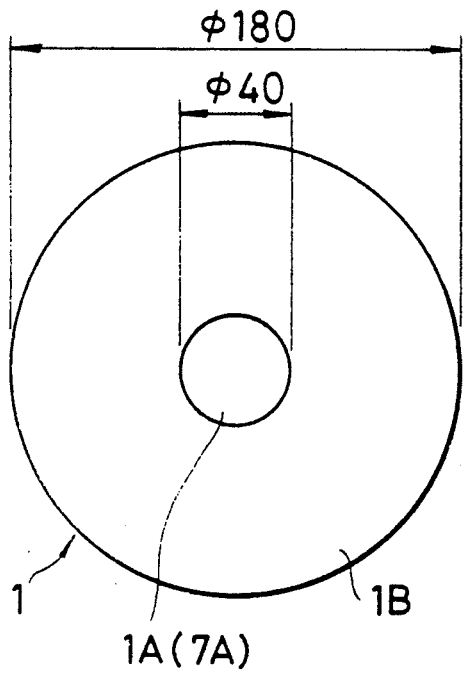
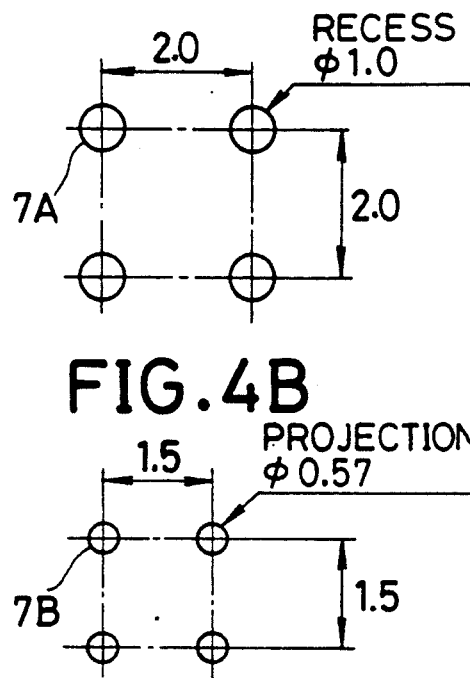
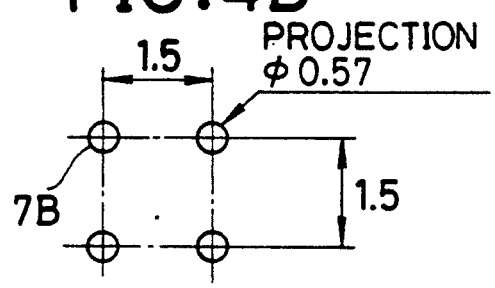
FIG.4A  FIG.4B
FIG.4C
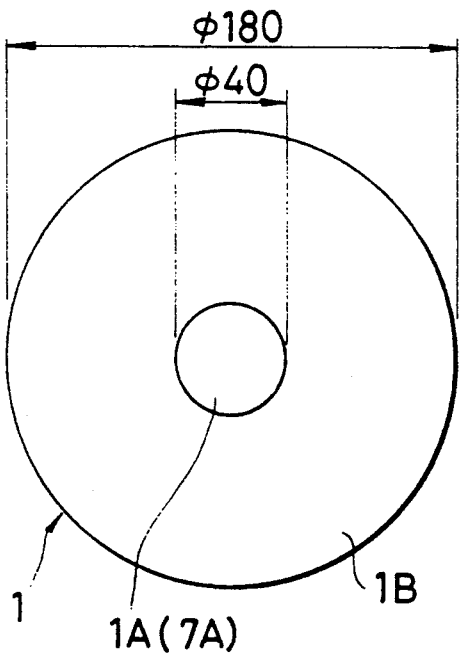
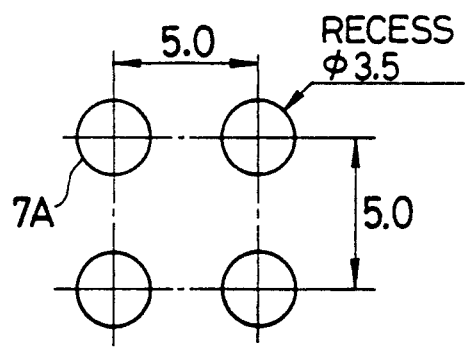
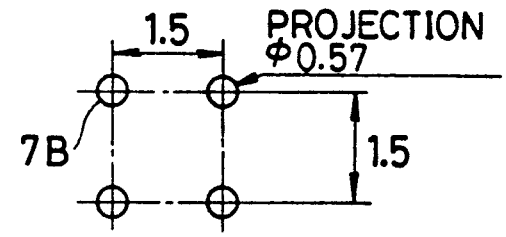
FIG.5A  FIG.5B
FIG.5C

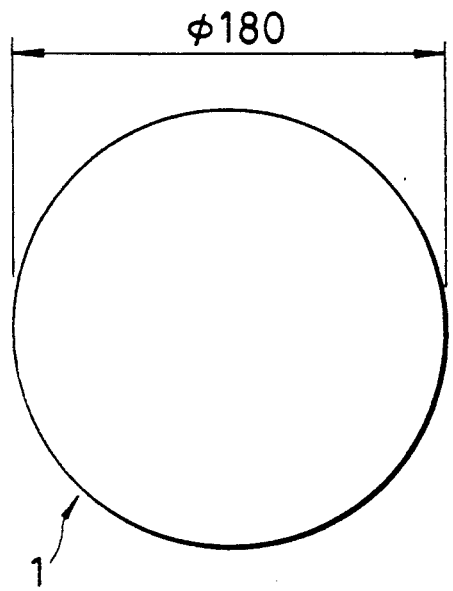
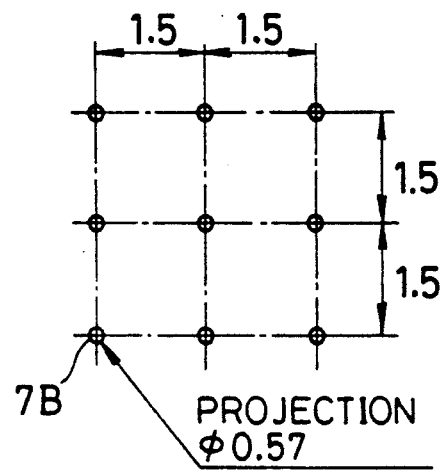
FIG.8A  FIG.8B
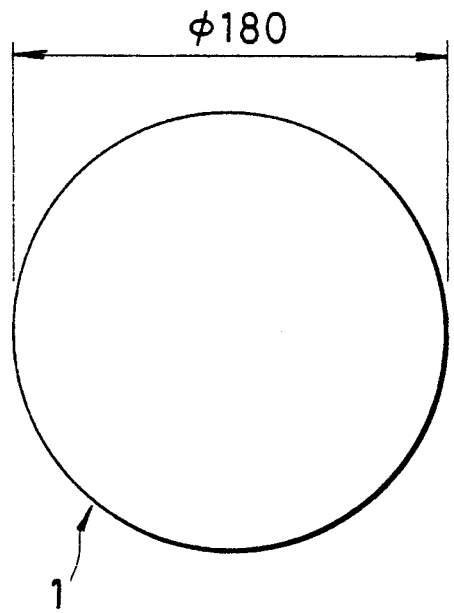
FIG.9

ELECTROSTATIC CHUCK

BACKGROUND OF THE INVENTION

1. Field of the Invention

The present invention relates to an electrostatic chuck for holding a wafer during treatment such as forming a thin film on the wafer or etching the same in a process for producing semiconductor devices according to the plasma CVD method or the plasma etching process and in particular to an electrostatic chuck which is capable of maintaining the temperature of the wafer uniform throughout the processing.

2. Description of the Prior Art

Until now, in the plasma CVD apparatuses and the plasma etching apparatuses, a wafer to be processed has been positioned on a substrate-supporting base under the influence of gravity or mechanically clamped to the base.

In these methods for positioning a wafer in the foregoing apparatuses, for instance, a method for positioning a wafer under the influence of gravity, the temperature of a wafer greatly increases in proportion to an increase in processing energy and the patterns formed on the wafer in the preceeding process are correspondingly damaged because of the low heat transmission rate in a vacuum. Therefore, the wafer cannot be treated at a high processing rate. On the other hand, in the clamping method, the processing precision of a wafer is impaired in the vicinity of the clamping tool. Therefore, the clamping of only a part of the periphery of the wafer is permitted during the processing, the contact pressure between the wafer and a base for cooling is reduced and accordingly the cooling efficiency is almost the same as that for the method in which the wafer is positioned under the influence of gravity. Moreover, the wafer causes mechanical strain even if a gas serving as a heat transmission medium is introduced between the wafer and the cooling base, and thus the uniform distribution of the wafer temperature cannot be ensured.

Thus, there has been a desire for the development of low temperature processing in order to solve the aforementioned problems and to finely and uniformly process the wafer. Under such circumstance, an electrostatic chuck which makes use of electrostatic attractive force has been developed and already put into practical use.

However, the electrostatic chuck which has been put into practical use likewise suffers from a problem of establishment of uniform temperature distribution in a wafer. To solve this problem, for instance, Japanese Patent Application Laid-Open No. 1-251735 discloses an electrostatic chuck having a complicated structure designed so as to introduce a gas between a wafer and the electrostatic chuck while adjusting the pressure of the gas.

SUMMARY OF THE INVENTION

Accordingly, it is an object of the present invention to provide an electrostatic chuck having a simple structure, which makes it possible to establish uniform temperature distribution in a wafer to be processed throughout processing thereof.

The inventors of this invention have conducted various studies to solve the foregoing problem associated with the conventional electrostatic chuck. They have discoverd that the heat transmission between a wafer and the electrostatic chuck, in a vacuum, is caused by a contact heat transmission mechanism therebetween; that the surface temperature distribution of the electrostatic chuck, observed when no wafer is positioned and processing energy is supplied, is such that the temperature essentially decreases in a concentric manner, i.e., from the center thereof towards the periphery along the radial direction; and that it is effective for establishing a uniform temperature distribution in a wafer to gradually decrease the effective contact area between the wafer and the electrostatic chuck from the center thereof along the radial direction.

According to the present invention, the foregoing object can effectively be achieved by providing an electrostatic chuck for holding a wafer, which makes use of an electrostatic attractive force and which is processed to make the surface thereof uneven so that the electrostatic chuck partially comes in contact with the wafer, wherein the surface of the electrostatic chuck is made uneven such that the proportion of the area occupied by projected portions in the peripheral portion, i.e., in the relatively outer region of the surface is smaller than that of the area occupied by projected portions in the central portion, i.e., in the relatively inner region of the surface of the electrostatic chuck in order to change the rate of heat transmission between the wafer and the electrostatic chuck.

In the present invention, the surface configuration of the electrostatic chuck may be designed such that the proportion of the area occupied by the projected portions is continuously reduced from the center of the surface to the outermost peripheral portion thereof.

Preferred surface configurations of the electrostatic chuck of the present invention include, for instance, those having the difference in level or the height of the projected portion ranging from 10 to 70 μm and the proportion of the area occupied by the projected portion in the peripheral region being not more than 50% of the proportion of the area occupied by the projected portion in the central region; those including a central region which corresponds to the region whose diameter is 10 to 50% of the diameter of the electrostatic chuck and which has a high proportion of the area occupied by projected portion; and those in which the proportion of the area occupied by the projected portion in the central region ranges from 25 to 100%.

When a cooling jacket maintained at a constant temperature is fitted to the reverse face of a disklike electrostatic chuck by clamping at the peripheral portion and energy is uniformly supplied to the surface of the electrostatic chuck free of a wafer, part of the energy is directed towards the water-cooling jacket as heat flow and the remaining part of the energy outwardly flows in the radial direction. This is because an electrostatic chuck in general has a structure in which an insulating base, a plate-like electrode and an insulating layer are laminated in this order and integrated together and the sides thereof serve as radiating surfaces. The cross section of the heat flow becomes large in proportion to the distance from the center of the chuck (i.e., the radius of the electrostatic chuck), but the energy within the region enclosed by the circle of this radius increases in proportion to the square of the radius. The density of heat flux directed towards the periphery along the radial direction correspondingly increases as the radius increases and the insulating material constituting the electrostatic chuck has a low thermal conductivity. This leads to the establishment of a radial temperature distribution on the surface of the electrostatic chuck in which the temperature gradient is small in the central region and gradually increases as the distance from the center increases or towards the periphery of the chuck. More specifically, the temperature of the central region of the electrostatic chuck is high compared with that observed at the periphery thereof due to the radiation through the side faces of the chuck and the heat transmission from the periphery of the chuck to the water-cooling jacket. When a wafer is put on the electrostatic chuck, the energy uniformly supplied to the wafer is transmitted to the electrostatic chuck through radiation and the same temperature distribution as that observed when no wafer is fitted to the chuck is established within the electrostatic chuck while assuming the presence of fine gaps between the wafer and the electrostatic chuck. On the other hand, heat transmission due to the radiation corresponds to that from the electrostatic chuck to the water-cooling jacket observed when no wafer is put thereon and likewise the same temperature distribution as that for the electrostatic chuck free of a wafer would be established within the wafer. In this temperature distribution, the overall temperature of the wafer is of course higher than that of the electrostatic chuck. Further, the thermal resistance of the wafer is large since the thermal conductivity of the wafer is high, but the wafer is thin and, therefore, the temperature gradient of the wafer in the radial direction is greater than that of the electrostatic chuck in the radial direction. As a result, the temperature difference between the wafer and the electrostatic chuck becomes great in the central portion and is gradually reduced as the distance from the center (i.e., radius) increases or towards the periphery. For this reason, if the contact area between the wafer and the electrostatic chuck having a high heat capacity in the central region is greater than that in the peripheral region, the contact thermal resistance in the central region becomes lower than that observed in the peripheral region and the rate of temperature drop observed in the central region becomes greater than that observed in the peripheral region. Accordingly, the temperature gradient within the wafer becomes low and thus the temperature of the wafer can be made uniform.

In the electrostatic chuck according to the present invention, the height of the projected portion formed on the surface of the chuck including both central and peripheral regions thereof is limited to the range of from 10 to 70 μm. This results from the fact that the electrostatic chuck in general has a structure in which plate-like electrodes are embedded in an insulating material comprising porcelain and the surface thereof on which a wafer is attracted is grained to a surface roughness on the order of μm and. Therefore, it is difficult to achieve processing precision on the order of 10 μm or less from a technical standpoint, while if the height is more than 70 μm, the wafer cannot always be attracted to and held on the chuck with certainty.

The above and other objects, effects, features and advantages of the present invention will become more apparent from the following description of embodiments thereof taken in conjunction with the accompanying drawings.

BRIEF DESCRIPTION OF THE DRAWINGS

FIG. 2A is a plan view showing the surface configuration of a first embodiment of the electrostatic chuck according to the present invention;

FIG. 2B is an enlarged view of a part of the peripheral portion of the electrostatic chuck shown in FIG. 2A;

FIG. 3A is a plan view showing the surface configuration of a second embodiment of the electrostatic chuck according to the present invention;

FIG. 3B is an enlarged view of a part of the peripheral portion of the electrostatic chuck shown in FIG. 3A;

FIG. 4A is a plan view showing the surface configuration of a third embodiment of the electrostatic chuck according to the present invention;

FIG. 4B is an enlarged view of a part of the central portion of the electrostatic chuck shown in FIG. 4A;

FIG. 4C is an enlarged view of a part of the peripheral portion of the electrostatic chuck shown in FIG. 4A;

FIG. 5A is a plan view showing the surface configuration of a fourth embodiment of the electrostatic chuck according to the present invention;

FIG. 5B is an enlarged view of a part of the central portion of the electrostatic chuck shown in FIG. 5A;

FIG. 5C is an enlarged view of a part of the peripheral portion of the electrostatic chuck shown in FIG. 5A;

FIG. 8A is a plan view showing the surface configuration of a first comparative embodiment of an electrostatic chuck given for the purpose of making comparison with the electrostatic chuck according to the present invention;

FIG. 8B is an enlarged view of a part of the electrostatic chuck shown in FIG. 8A;

FIG. 9 is a plan view showing the surface configuration of a second comparative embodiment of an electrostatic chuck given for the purpose of making comparison with the electrostatic chuck according to the present invention;

DESCRIPTION OF THE PREFERRED EMBODIMENTS

Figure 1:
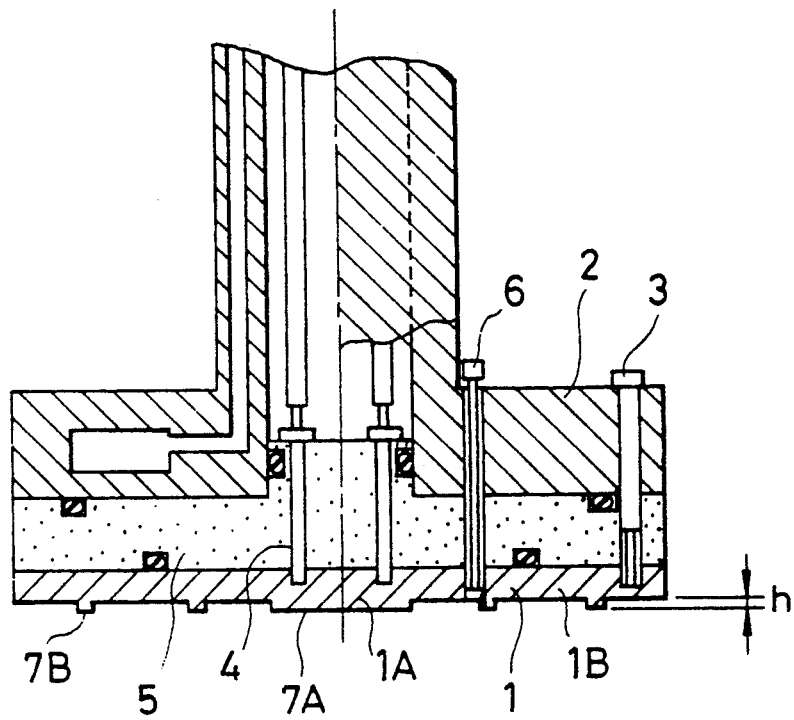
FIG. 1 is a cross sectional view showing the whole structure of an apparatus for holding a wafer provided with the electrostatic chuck according to the present invention.

Referring now to the attached figures, FIG. 1 is a cross sectional view of the whole apparatus for holding a wafer provided with the electrostatic chuck according to the present invention. The electrostatic chuck 1 is attached to a water-cooling jacket 2 through an insulating plate 5 by fastening them with bolts 3 at the periphery thereof. The water-cooling jacket 2 has a central portion formed into a cylindrical shape in which a distributing wiring is provided and the wiring is connected to power supply terminals 4 for applying an electric voltage for attraction to the electrostatic chuck 1. Sealing means are disposed between the electrostatic chuck and the insulating plate 5 and between the insulating plate 5 and the water-cooling jacket 2. The electrostatic chuck is provided with a pin 6 for releasing the attracted wafer.

In this embodiment, the surface configuration of the electrostatic chuck 1 comprises a first region or a central region 1A consisting of a projection 7A and a second region or a peripheral region 1B concentric with the first region 1A, on which projections 7B are formed.

In FIG. 1, h defines a difference of level between a projection and an adjacent recess and ranges from 10 to 70 μm in this embodiment (in the figure, the size of h is exaggerated for the purposes of illustration.

In FIGS. 2 to 7, there are shown embodiments 1 to 6 of the electrostatic chuck according to the present invention and FIGS. 8 and 9 show comparative embodiments given for the purpose of making comparison with the embodiments of the present invention. In FIGS. 2 to 9, the diameter of the electrostatic chuck is 180 mm.

In the electrostatic chuck 1 shown in FIG. 2, the central region 1A is in a circular shape having a diameter of 40 mm and the whole of the central region 1A comprises a projected surface portion 7A as shown in FIG. 2A. On the other hand, projections 7B having a diameter of 0.57 mm as a dot pattern are arranged on the peripheral region 1B of the electrostatic chuck 1 at regular intervals (pitch=1.5 mm) as shown in FIG. 2B (not shown in FIG. 2A). In this first embodiment, the diameter of the central region 1A is about 22% of the diameter of the electrostatic chuck 1. In addition, the proportion of the area occupied by the projection 7A with respect to the total area of the central region 1A as the first region is 100% while the proportion of the area occupied by the projections 7B with respect to the total area of the peripheral region 1B as the second region is 11%.

In the electrostatic chuck 1 shown in FIG. 3, the central region 1A is in a circular shape having a diameter of 60 mm and the whole of the central region 1A comprises a projected surface portion 7A as shown in FIG. 3A. On the other hand, projections 7B having a diameter of 1.13 mm as a dot pattern are arranged on the peripheral region 1B of the electrostatic chuck 1 at regular intervals (pitch=2.0 mm) as shown in FIG. 3B (not shown in FIG. 3A). In this second embodiment, the diameter of the central region 1A is about 33% of the diameter of the electrostatic chuck 1. In addition, the proportion of the area occupied by the projection 7A with respect to the total area of the central region 1A as the first region is 100% while the proportion of the area occupied by the projections 7B with respect to the total area of the peripheral region 1B as the second region is 25%.

In the electrostatic chuck 1 shown in FIG. 4, the central region 1A is in a circular shape having a diameter of 40 mm as shown in FIG. 4A, recesses 7A having a diameter of 1.0 mm as a dot pattern are formed on the central region 1A at regular intervals (pitch=2.0 mm) and the remaining flat surface serves as a projection as shown in FIG. 4B. On the other hand, projections 7B having a diameter of 0.57 mm as a dot pattern are arranged on the peripheral region 1B of the electrostatic chuck 1 at regular intervals (pitch=1.5 mm) as shown in FIG. 4C (not shown in FIG. 4A). In this third embodiment, the diameter of the central region 1A is about 22% of the diameter of the electrostatic chuck 1. In addition, the proportion of the area occupied by the projections 7A with respect to the total area of the central region 1A as the first region is 80% while the proportion of the area occupied by the projections 7B with respect to the total area of the peripheral region 1B as the second region is 11%.

In the electrostatic chuck 1 shown in FIG. 5, the central region 1A is in a circular shape having a diameter of 40 mm as shown in FIG. 5A, recesses 7A having a diameter of 3.5 mm as a dot pattern are formed on the central region 1A at regular intervals (pitch=5.0 mm) and the remaining flat surface serves as a projection as shown in FIG. 5B. On the other hand, projections 7B having a diameter of 0.57 mm as a dot pattern are arranged on the peripheral region of the electrostatic chuck 1 at reguaIr intervals (pitch =1.5 mm) as shown in FIG. 5C (not shown in FIG. 5A). In this fourth embodiment, the diameter of the central region 1A is about 22% of the diameter of the electrostatic chuck 1. In addition, the proportion of the area occupied by the projections 7A with respect to the total area of the central region 1A as the first region is 62% while the proportion of the area occupied by the projections 7B with respect to the total area of the peripheral region 1B as the second region is 11%.

Figure 6A:
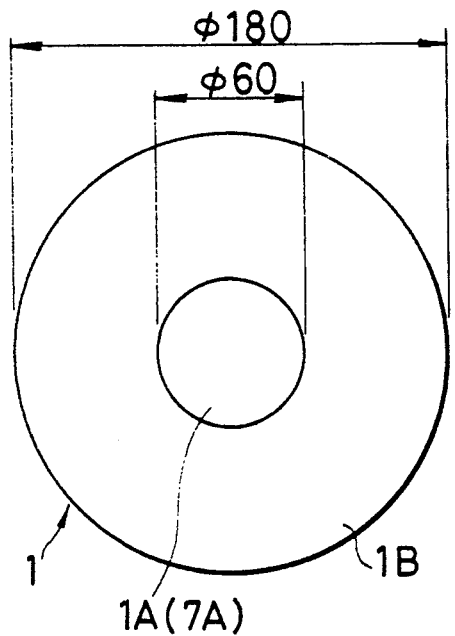
FIG. 6A is a plan view showing the surface coinfiguration of a fifth embodiment of the electrostatic chuck according to the present invention.
Figure 6B:
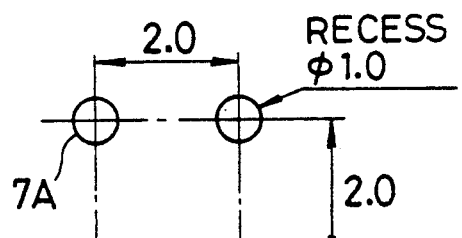
FIG. 6B is an enlarged view of a part of the central portion of the electrostatic chuck shown in FIG. 6.
Figure 6C:
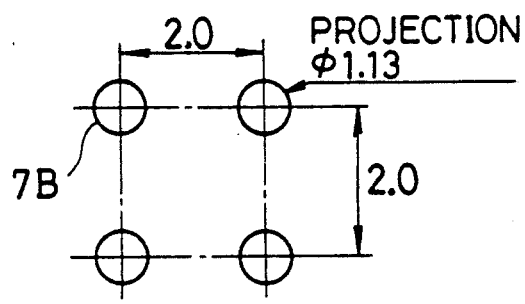
FIG. 6C is an enlarged view of a part of the peripheral portion of the electrostatic chuck shown in FIG. 6A.

In the electrostatic chuck 1 shown in FIG. 6, the central region 1A is in a circular shape having a diameter of 60 mm as shown in FIG. 6A, recesses 7A having a diameter of 1.0 mm as a dot pattern are arranged on the central region 1A at regular intervals (pitch=2.0 mm) and the remaining flat surface serves as a projection as shown in FIG. 6B. On the other hand, projections 7B having a diameter of 1.13 mm as a dot pattern are arranged on the peripheral region of the electrostatic chuck 1 at regular intervals (pitch =2.0 mm) as shown in FIG. 6C (not shown in FIG. 6A). In this fifth embodiment, the diameter of the central region 1A is about 33% of the diameter of the electrostatic chuck 1. In addition, the proportion of the area occupied by the projections 7A with respect to the total area of the central region 1A as the first region is 80% while the proportion of the area occupied by the projections 7B with respect to the total area of the peripheral region 1B as the second region is 25%.

Figure 7A:
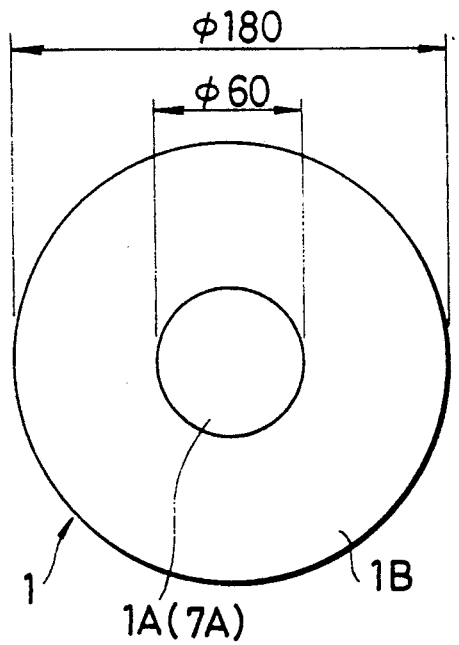
FIG. 7A is a plan view showing the surface configuration of a sixth embodiment of the electrostatic chuck according to the present invention.
Figure 7B:
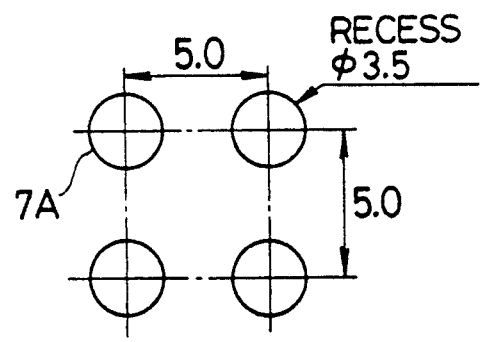
FIG. 7B is an enlarged view of a part of the central portion of the electrostatic chuck shown in FIG. 7A.
Figure 7C:
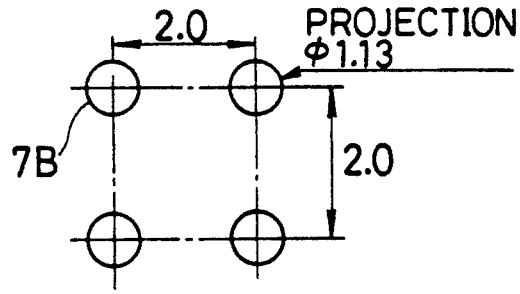
FIG. 7C is an enlarged view of a part of the peripheral portion of the electrostatic chuck shown in FIG. 7A.
Figure 10A:
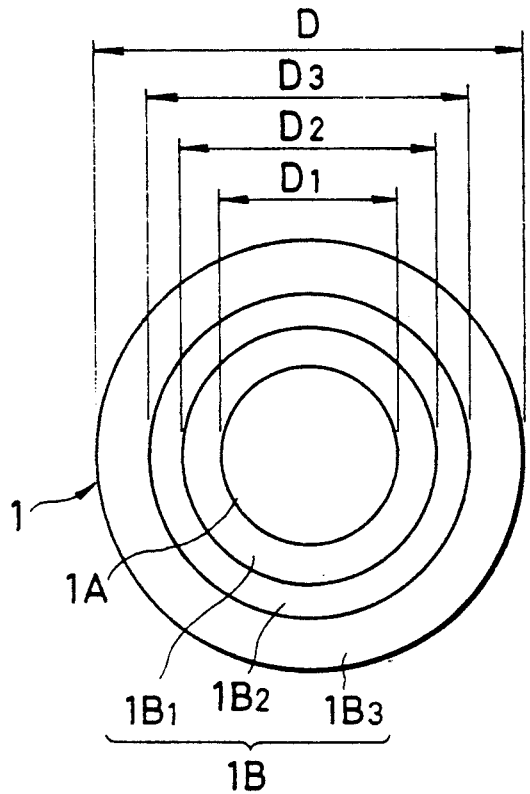
FIG. 10A is a plan view showing the surface configuration of an embodiment of the electrostatic chuck according to the present invention, the surface configuration being designed with emphasis on the cooling properties.
Figure 10B:
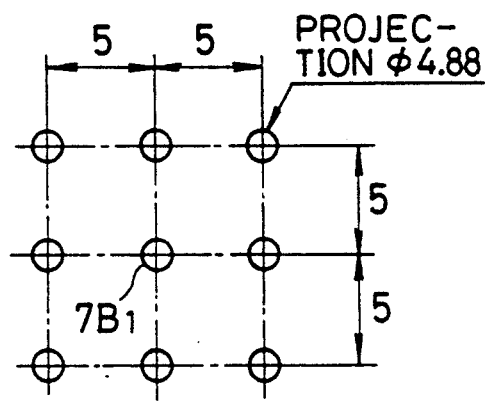
FIG. 10B is an enlarged view of a part of the second region shown in FIG. 10A.
Figure 10C:
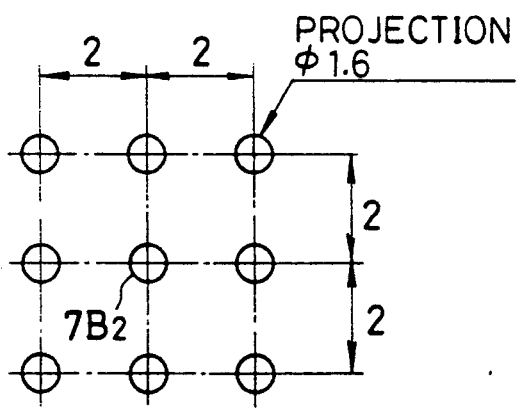
FIG. 10C is an enlarged view of a part of the third region shown in FIG. 10A.
Figure 10D:
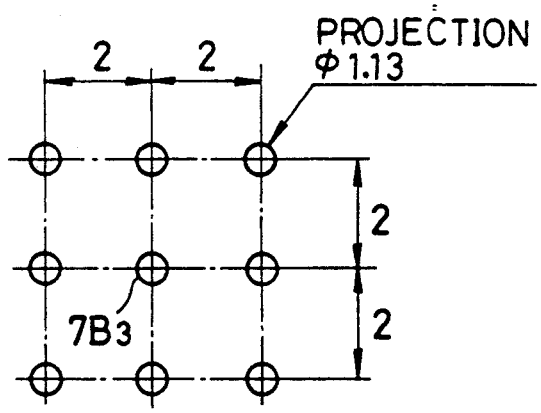
FIG. 10D is an enlarged view of a part of the fourth region shown in FIG. 10A.

In the electrostatic chuck 1 shown in FIG. 7, the central region 1A is in a circular shape having a diameter of 60 mm as shown in FIG. 7A, recesses 7A having a diameter of 3.5 mm as a dot pattern are arranged on the central region 1A at regular intervals (pitch=5.0 mm) and the remaining flat surface serves as a projection as shown in FIG. 7B. On the other hand, projections 7B having a diameter of 1.13 mm as a dot pattern are arranged on the peripheral region of the electrostatic chuck 1 at regular intervals (pitch =2.0 mm) as shown in FIG. 7C (not shown in FIG. 7A). In this sixth embodiment, the diameter of the central region 1A is about 33% of the diameter of the electrostatic chuck 1. In addition, the proportion of the area occupied by the projections 7A with respect to the total area of the central region 1A as the first region is 62% while the proportion of the area occupied by the projections 7B with respect to the total area of the peripheral region 1B as the second region is 25%.

On the other hand, in the electrostatic chuck 1 shown is FIG. 8 as a comparative embodiment, projections having a diameter of 0.57 mm distributed in the form of a dot pattern are formed, at regular intervals (pitch=1.5 mm) throughout the entire surface of the electrostatic chuck 1 including both central and peripheral regions as shown in FIG. 8B (not shown in FIG. 8A).

In another comparative embodiment of an electrostatic chuck 1 shown in FIG. 9, no recess is formed on the entire surface i.e., including both central and peripheral regions, which is hence completely even.

Using the electrostatic chuck 1 according to the embodiments shown in FIGS. 2 to 7 and the comparative embodiments shown in FIGS. 8 and 9, the temperature distributions on the wafer and the electrostatic chuck observed when a uniform plasma energy was supplied thereto were determined. The results thus obtained are summarized in the following Table 1.

TABLE 1

| Sample No. | Surface Configuration | Temp. of Electrostatic Chuck | | Temp. of Wafer (°C.) | | |
|---|---|---|---|---|---|---|
| | | Center (°C.) | Periphery (°C.) | Center | Periphery | ΔT |
| 1 | FIG. 2 | 86 | 31 | 253 | 224 | 29 |
| 2 | FIG. 3 | 67 | 31 | 182 | 116 | 66 |
| 3 | FIG. 4 | 108 | 75 | 305 | 268 | 37 |
| 4 | FIG. 5 | 100 | 76 | 332 | 275 | 57 |
| 5 | FIG. 6 | 88 | 75 | 226 | 158 | 68 |
| 6 | FIG. 7 | 83 | 77 | 247 | 164 | 83 |
| 7 | FIG. 8 | 40 | 34 | 447 | 194 | 253 |
| 8 | FIG. 9 | 57 | 32 | 157 | 54 | 103 |

ΔT means the temperature difference between the central region and the peripheral region of the wafer.

As seen from the results listed in Table 1, ΔT of the wafer was more than 100° C. when the comparative electrostatic chucks shown in FIGS. 8 and 9 were used, while when the electrostatic chucks according to the present invention as shown in FIGS. 2 to 7 were employed, the temperature difference ΔT was substantially reduced and rather uniform temperature distributions were established on the wafer surface. In particular, the best effects were attained by the embodiment shown in FIG. 2.

According to the wafer attraction-release test performed by the inventors, the lowest wafer temperature (most excellent cooling properties) can be achieved by the electrostatic chuck shown in FIG. 9, but the attractive force thereof is greatly influenced by the conditions (surface configurations) of the reverse face of the wafer. The remaining attractive force during the disconnection of the wafer is markedly great. Accordingly, stable attraction and release of the wafer cannot be ensured and thus the electrostatic chuck of this type cannot be practically acceptable.

Another embodiment which differs from the foregoing embodiments and is designed with emphasis on the cooling properties is shown in FIG. 10. As seen from FIG. 10A, the surface of this electrostatic chuck is divided into four regions which are concentrically arranged. The central region 1A is in a circular shape having a diameter $D_1$ of 76 mm and all of the central region 1A constitutes or serves as a projected portion. On the other hand, the peripheral region 1B comprises three ring-like regions $1B_1$, $1B_2$ an $1B_3$. The region $1B_1$ which corresponds to a region existing between the diameters $D_1$ and $D_2$ (76 mm to 106 mm) has projections having a diameter of 4.88 mm as a dot pattern arranged at regular intervals (pitch=5 mm) as shown in FIG. 10B (not shown in FIG. 10A). The region $1B_2$ which corresponds to a region existing between the diameters $D_2$ and $D_3$ (106 mm to 130 mm) has projections having a diameter of 1.6 mm as a dot pattern arranged at regular intervals (pitch=2 mm) as shown in FIG. 10C. Further, the region $1B_3$ which corresponds to a region existing between the diameters $D_3$ and D (130 mm to 180 mm) has projections having a diameter of 1.13 mm as a dot pattern arranged at regular intervals (pitch=2 mm) as shown in FIG. 10D. In this embodiment, the proportion of the area occupied by the projections with respect to the total area of each region 1A, $1B_1$, $1B_2$ and $1B_3$ is 100%, 72%, 50% and 25%, respectively.

The results of another experimental test performed using the electrostatic chucks shown in FIGS. 9 and 10 are summarized in the following Table 2.

TABLE 2

| Sample No. | Surface Configuration | Temperature of Wafer (°C.) | | |
|---|---|---|---|---|
| | | Center | Periphery | ΔT |
| 1 | FIG. 10 | 113 | 91 | 22 |
| 2 | FIG. 9 | 108 | 79 | 29 |

As seen from the results listed in Table 2, the wafer temperature observed for the electrostatic chuck shown in FIG. 10 is almost the same as that observed for the electrostatic chuck shown in FIG. 9 and the wafer temperature distribution established by the electrostatic chuck shown in FIG. 10 is slightly superior to that achieved by the electrostatic chuck shown in FIG. 9.

From the foregoing temperature characteristics and attraction-release characteristics of the electrostatic chuck, it can be concluded that the difference in level or the height of the projection preferably ranges from 10 to 70 μm; that the maximum contact area (proportion of the area occupied by the projection) in the central region preferably ranges from 25 to 100%; that the proportion of the contact area in the peripheral region is preferably not more than 50% of the proportion of the contact area of the central region; and that the surface of the chuck is concentrically divided into two regions, the boundary of which is a circle having a diameter preferably corresponding to 10 to 50% of the diameter of the electrostatic chuck, or preferably into three or more regions and the proportion of contact area is preferably changed continuously.

According to the present invention, the heat transmission rate is controlled by utilizing an electrostatic chuck as a wafer holder to hold a wafer without coming in contact with the wafer surface to be processed, forcing the electrostatic chuck to cool and simultaneously changing the contact area between the wafer and the electrostatic chuck in the radial direction. Therefore, it is not necessary to adopt any complicated structure and/or auxiliary means for controlling temperature. As a result, a wafer holder of high reliability can be provided with a low cost of equipment.

In addition, the electrostatic chuck of the present invention makes it possible to substantially reduce the probability of contamination of wafers which becomes a cause of various property-changes in the resulting semiconductor microdevices since the electrostatic chuck holds the wafers without coming in contact with the wafer surface to be processed.

It is a matter of course that the optimum temperature for processing a wafer can easily be established by properly controlling the temperature of the cooling medium used for compulsorily cooling the electrostatic chuck although any specific embodiment is not given in the foregoing description.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. An electrostatic chuck, comprising: a body having a substantially circular surface with an area equal to that of a disk-shaped substrate to be processed, said circular surface having a plurality of concentric regions including at least an inner region and an outer region, each region having a projected surface which comes in contact with the disk-shaped substrate, at least said outer region having a recessed surface which does not come in contact with the disk-shaped substrate, the projected surface in the outer region occupying a proportion of area of the outer region which is no more than 50% of the proportion of an area occupied by the projection surface in said inner region.

2. The electrostatic chuck according to claim 1, wherein the proportion of the area occupied by the projected surfaces is continuously reduced in a direction from the inner region to the outer region.

3. The electrostatic chuck according to claim 1, wherein the projected the recessed surfaces have a difference in level which ranges from 10 to 70 $\mu$m.

4. The electrostatic chuck according to claim 2, wherein the projected and recessed surfaces have a difference in level which ranges from 10 to 70 $\mu$m.

5. The electrostatic chuck according to claim 1, wherein said inner region has a diameter which ranges from 10 to 50% of the diameter of the circular surface.

6. The electrostatic chuck according to claim 3, wherein said inner region has a diameter which ranges from 10 to 50% of the diameter of the circular surface.

7. The electrostatic chuck according to claim 4, wherein said inner region has a diameter which ranges from 10 to 50% of the diameter of the circular surface.

8. The electrostatic chuck according to claim 1, wherein the projected surface in the inner region occupies an area which ranges from 25 to 100% of a total area of said inner region.

9. The electrostatic chuck according to claim 3, wherein the projected surface in the inner region occupies an area which ranges from 25 to 100% of a total area of said inner region.

10. The electrostatic chuck according to claim 6, wherein the projected surface in the inner region occupies an area which ranges from 25 to 100% of a total area of said inner region.

11. The electrostatic chuck according to claim 7, wherein the projected surface in the inner region occupies an area which ranges from 25 to 100% of a total area of said inner region.

12. The electrostatic chuck according to claim 1, wherein the projected surfaces comprise projections arranged at predetermined intervals.

13. The electrostatic chuck according to claim 2, wherein the projected surfaces comprise projections arranged at predetermined intervals.

* * * * *

UNITED STATES PATENT AND TRADEMARK OFFICE
CERTIFICATE OF CORRECTION

PATENT NO. : 5,160,152

DATED : November 3rd, 1992

INVENTOR(S) : Makoto TORAGUCHI et al.

It is certified that error appears in the above-identified patent and that said Letters Patent is hereby corrected as shown below:

<u>IN THE CLAIMS</u>:

In Claim 1, at Column 9, lines 35 to 36, delete "with an area equal to that of a disk-shaped substrate to be processed";

line 40, change "the" to --a--; and line 40, after "substrate" insert --to be processed--.

Signed and Sealed this

Twenty-sixth Day of October, 1993

Attest:

BRUCE LEHMAN

Attesting Officer

Commissioner of Patents and Trademarks